United States Patent
Brown et al.

(10) Patent No.: US 6,952,113 B2
(45) Date of Patent: Oct. 4, 2005

(54) METHOD OF REDUCING LEAKAGE CURRENT IN SUB ONE VOLT SOI CIRCUITS

(75) Inventors: Richard B. Brown, Ann Arbor, MI (US); Ching-Te K. Chuang, South Salem, NY (US); Peter W. Cook, Mount Kisco, NY (US); Koushik K. Das, Yorktown Heights, NY (US); Rajiv V. Joshi, Yorktown Heights, NY (US)

(73) Assignee: International Business Machines Corp., Armonk, NY (US)

( * ) Notice: Subject to any disclaimer, the term of this patent is extended or adjusted under 35 U.S.C. 154(b) by 106 days.

(21) Appl. No.: 10/644,211

(22) Filed: Aug. 20, 2003

(65) Prior Publication Data

US 2005/0040881 A1 Feb. 24, 2005

(51) Int. Cl.[7] .............................................. A03K 19/003
(52) U.S. Cl. ......................... 326/33; 326/17; 326/112; 326/119
(58) Field of Search .............................. 326/17, 33, 112, 326/119, 121

(56) References Cited

U.S. PATENT DOCUMENTS

| | | | | |
|---|---|---|---|---|
| 5,726,946 A | * | 3/1998 | Yamagata et al. | 365/226 |
| 6,118,328 A | * | 9/2000 | Morikawa | 327/534 |
| 6,242,948 B1 | * | 6/2001 | Makino | 326/81 |
| 6,559,708 B2 | * | 5/2003 | Notani | 327/537 |

* cited by examiner

Primary Examiner—Anh Q. Tran
(74) Attorney, Agent, or Firm—Law Office of Charles W. Peterson, Jr.; Louis J. Percello, Esq.; Satheesh K. Karra, Esq.

(57) ABSTRACT

A multi-threshold integrated circuit (IC) with reduced sub-threshold leakage and method of reducing leakage. Selectable supply switching devices (NFETs and/or PFETs) between a logic circuit and supply connections ($V_{dd}$ and Ground) for the circuit have higher thresholds than normal circuit devices. Some devices may have thresholds lowered when the supply switching devices are on. Header/footer devices with further higher threshold voltages and widths may be used to further increase off resistance and maintain/reduce on resistance. Alternatively, high threshold devices may be stacked to further reduce leakage to a point achieved for an even higher threshold. Intermediate supply connects at the devices may have decoupling capacitance and devices may be tapered for optimum stack height and an optimum taper ratio to minimize circuit leakage and circuit delay.

19 Claims, 16 Drawing Sheets

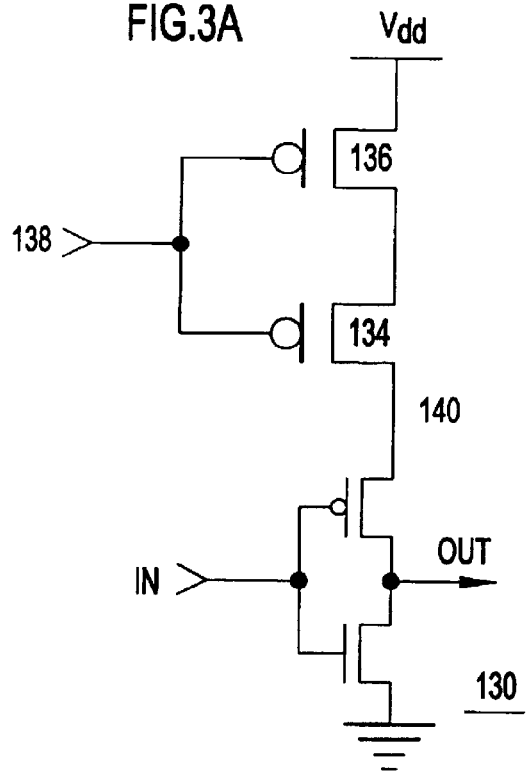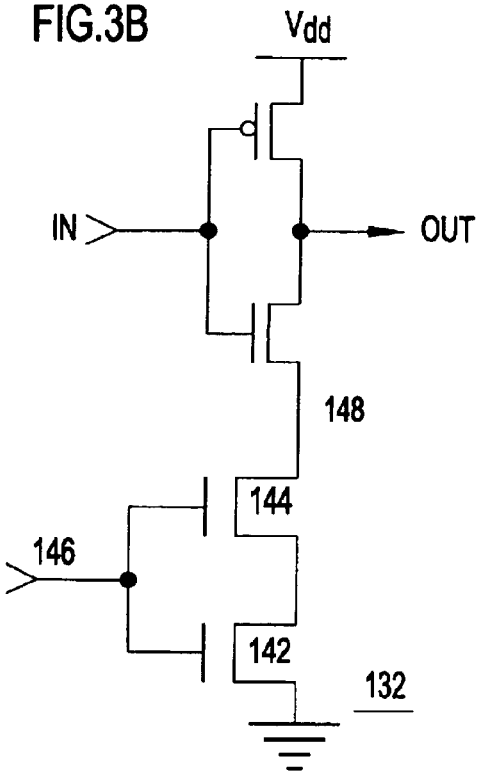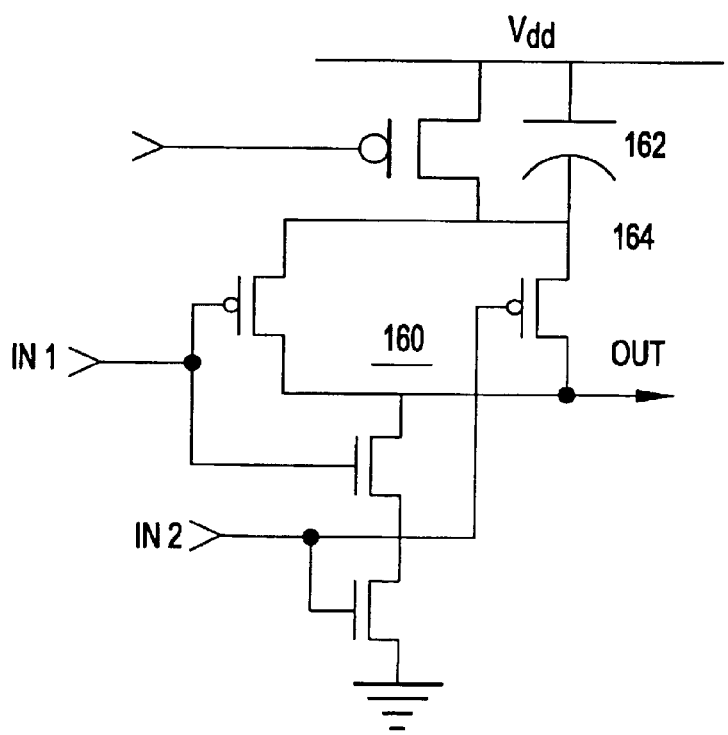

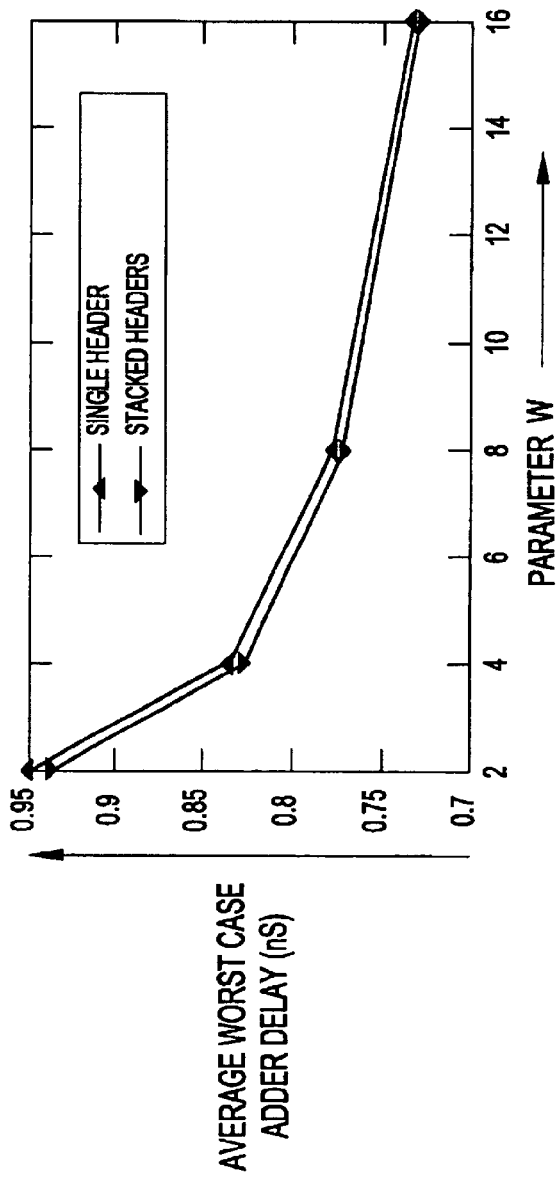
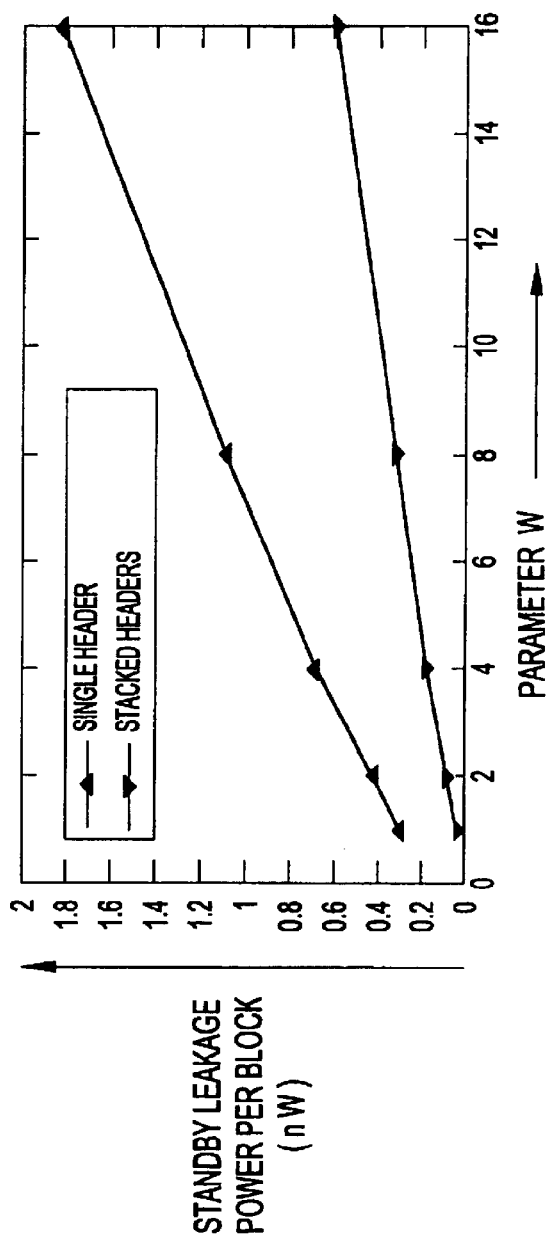

METHOD OF REDUCING LEAKAGE CURRENT IN SUB ONE VOLT SOI CIRCUITS

BACKGROUND OF THE INVENTION

1. Field of the Invention

The present invention is related to integrated circuit power consumption and more particularly to reducing static random access memory (SRAM) power consumption.

2. Background Description

Semiconductor technology and chip manufacturing advances have resulted in a steady decrease of chip feature size to increase on-chip circuit switching frequency (circuit performance) and the number of transistors (circuit density). Generally, all other factors being constant, the active power consumed by a given unit increases linearly with switching frequency. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, reducing net power consumption is important but, such a power reduction must come without degrading chip/circuit performance below acceptable levels.

To minimize semiconductor circuit power consumption, most integrated circuits (ICs) are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (modeled simply as a closed switch), the other device (the PFET) is off, not conducting (ideally modeled as an open switch) and, vice versa. Thus, ideally, there is no static or DC current path in a typical CMOS circuit.

A CMOS inverter, for example, is a PFET and NFET pair that are series connected between a power supply voltage ($V_{dd}$) and ground (GND). Both are gated by the same input and both drive the same output, typically a capacitive load. The PFET pulls the output high and the NFET pulls the output low at opposite input signal states. Ideally, when the gate of a NFET is below some positive threshold voltage ($V_T$) with respect to its source, the NFET is off, i.e., the switch is open. Above $V_T$, the NFET is on conducting current, i.e., the switch is closed. Similarly, a PFET is off when its gate is above its $V_T$, i.e., less negative, and on below $V_T$. So, ideal CMOS circuits use no static or DC power and only consume transient power from charging and discharging capacitive loads.

In practice however, typical FETs are much more complex than switches and transient power for circuit loads accounts for only a portion of CMOS circuit power consumption. FET drain to source current (DC current and so, DC power consumed) is dependent upon circuit conditions and device voltages. Especially as FET features shrink, FETs conduct what is known as subthreshold current, i.e., at gate biases below threshold for NFETs and above for PFETs. Further, for a particular device, subthreshold current increases exponentially with the magnitude of the device's drain to source voltage ($V_{ds}$) and reduces exponentially with the magnitude of the device's $V_T$. This is especially true in what is known as partially depleted (PD) or fully depleted (FD) silicon on insulator (SOI) technologies, where subthreshold leakage has been shown to increase dramatically, such that it may be the dominant source of leakage. Additional device leakages including gate leakages (i.e., gate to channel, gate to source or drain and gate induced drain leakage (GIDL)) and source/drain junction leakages also contribute to static power.

When multiplied by the millions and even billions of devices on a state of the art IC, even 100 picoAmps (100 pA) of leakage in each of a million devices, for example, results in chip leakage on the order of 100 milliAmps (100 mA). Thus, as chip features have shrunk, these leakage sources have become more prominent. While increasing device $V_T$ (e.g., with thicker gate oxide or body biasing device channels) can reduce subthreshold leakage, typically, these leakage reduction techniques increase circuit size, e.g., to accommodate body contacts at devices and/or to compensate for worse (slower) circuit performance by devices with higher $V_T$s. Generally, and especially with the large number of circuits and circuit devices on a particular chip, device leakage (both gate and subthreshold) reduction techniques have been applied uniformly across circuits or chips to reduce leakage power; accepting an across the board performance and/or chip density degradation, regardless of whether application of the particular technique affected leakage reduction for any particular circuit or circuit block.

Thus, there is a need for reduced IC leakage with minimal performance degradation and in particular for maximizing device off resistance while minimizing device on resistance, especially for PD and FD SOI ICs.

SUMMARY OF THE INVENTION

It is a purpose of the invention to reduce integrated circuit (IC) leakage;

It is another purpose of the invention to reduce IC leakage while minimizing performance degradation;

It is yet another purpose of the invention to reduce IC leakage while minimizing performance degradation in PD and FD SOI ICs;

It is yet another purpose of the invention to maximize device off resistance and minimize device on resistance in PD and FD SOI ICs.

The present invention relates to a multi-threshold integrated circuit (IC) with reduced subthreshold leakage and method of reducing leakage. Selectable supply switching devices (NFETs and/or PFETs) between a logic circuit and supply connections ($V_{dd}$ and Ground) for the circuit have higher thresholds than normal circuit devices. Some devices may have the magnitude of thresholds lowered when the supply switching devices are on. Alternatively, high threshold devices may be stacked to further reduce leakage to a point achieved for an even higher threshold. Intermediate supply connects at the devices may have decoupling capacitance and devices may be tapered for optimum stack height and an optimum taper ratio to minimize circuit leakage and circuit delay.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A–B show examples of circuits with 2 stacked, series connected floating body header or footer devices;

FIGS. 4A–D show circuit performance and leakage comparisons at two different supply voltages;

FIG. 5 shows an example of a NAND gate with decoupling capacitors that may be provided in parallel with header devices;

DESCRIPTION OF PREFERRED EMBODIMENTS

Figure 1:
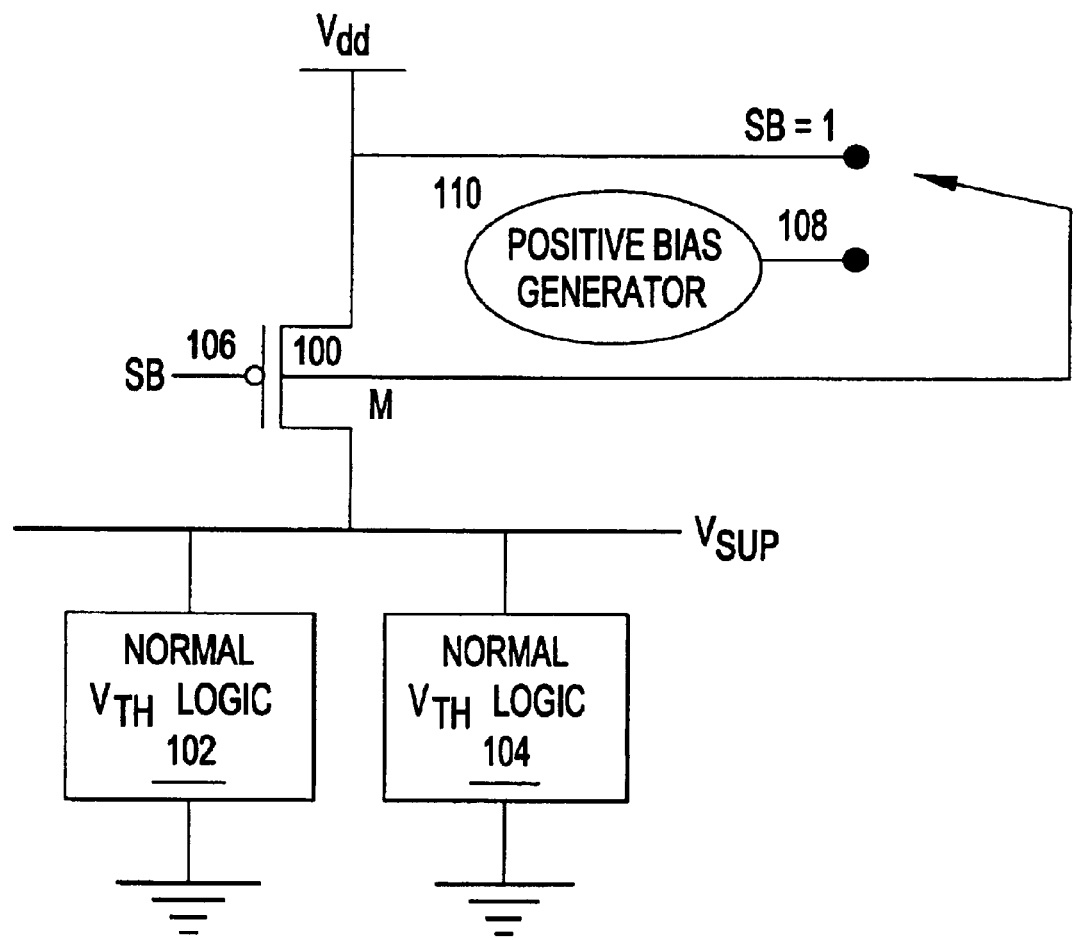
FIG. 1 shows a multi-threshold CMOS (MTCMOS) technology example, wherein supply switching devices selectively alternately supply power and isolate logic circuits.

Turning now to the drawings and, more particularly, FIG. 1 shows a multi-threshold CMOS (MTCMOS) technology example of a preferred embodiment of the present invention, wherein supply switching devices 100 selectively alternately supply power and isolate logic circuits 102, 104. In this first example, switching devices 100 are field effect transistors (FETs) with higher thresholds than logic circuit FETs. It should be noted that as used herein, high threshold or higher threshold devices refers to devices with process features included to increase the magnitude of device threshold above base process devices, e.g., with thicker gate oxide, extra implants and etc. Further, it is understood that although an example may be directed to a particular device type, whether p-type header or n-type footer, this is for example only and not intended as a limitation.

So, in this example the switching or header devices 100 are p-type FETs (PFETs) with higher threshold voltages than PFETs in logic circuits 102, 104. A control signal 106 is provided to the gates of the PFET header devices 100. A switchable bias voltage, e.g., a switch 108 switching between a bias generator 110 and supply line ($V_{dd}$), biases the switching devices 100. The bias generator 110 supplies a voltage approximately less than a diode drop below $V_{dd}$ (e.g., ~$V_{dd}$–0.7V) and may bias a large number of such biased body or body biased devices. Preferably, the bias generator 110 uses long channel length FETs primarily to reduce power dissipation during active operation. Moreover, the control signal switches a high threshold ($V_T$) transistor off during standby mode between $V_{dd}$ and the bias generator 110 to reduce bias generator 110 standby leakage power.

When the control signal 106 is low in this example to hold switching devices 100 on, which passes the supply and so, the logic circuits 102, 104 are active. The control signal 106 also switches the switchable bias voltage 108 such that the body bias voltage to switching devices 100 is connected to bias generator 110 and slightly forward biases switching device junctions. The body bias reduces the magnitude of switching device 100 threshold, preferably to that of logic circuit FETs or more, and turns on the switching device 100 harder. When normal logic operation is completed, the control signal 106 is driven high in this example to turn off the switching devices 100, which isolates the logic circuits 102, 104 from $V_{dd}$ and placing the logic circuits 102, 104 in sleep or standby mode. Simultaneously, the control signal 106 switches the switchable bias voltage 108 to provide $V_{dd}$ as body bias to switching devices 100. So, in sleep mode with $V_{dd}$ as body bias, the switching device 100 parameters shift, increasing device threshold magnitude to minimize device (gate and subthreshold) leakage, and further isolate and minimize logic circuit 102, 104 leakage. Also, since the actual logic devices do not have body contacts, they have no direct path for gate-to-body tunneling current to circuit power supplies in SOI technology. Hence, gate leakage is also effectively controlled.

Figure 2A:
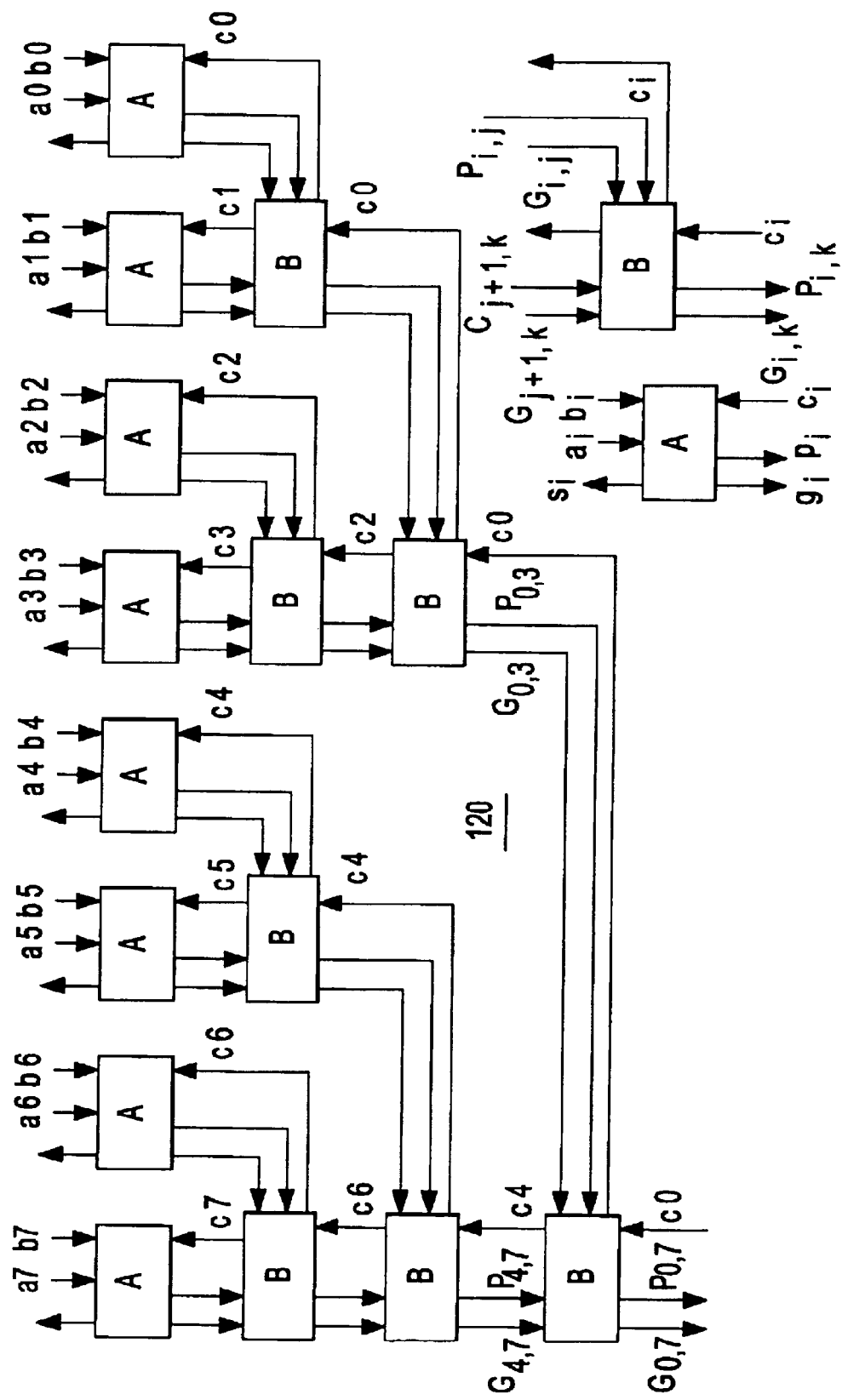
FIGS. 2A–C show a block diagram of a static 32-bit carry-lookahead adder with corresponding worst case delays for various body bias conditions for 0.5 and 2 micron ($\mu$m) wide switching devices.
Figure 2B:
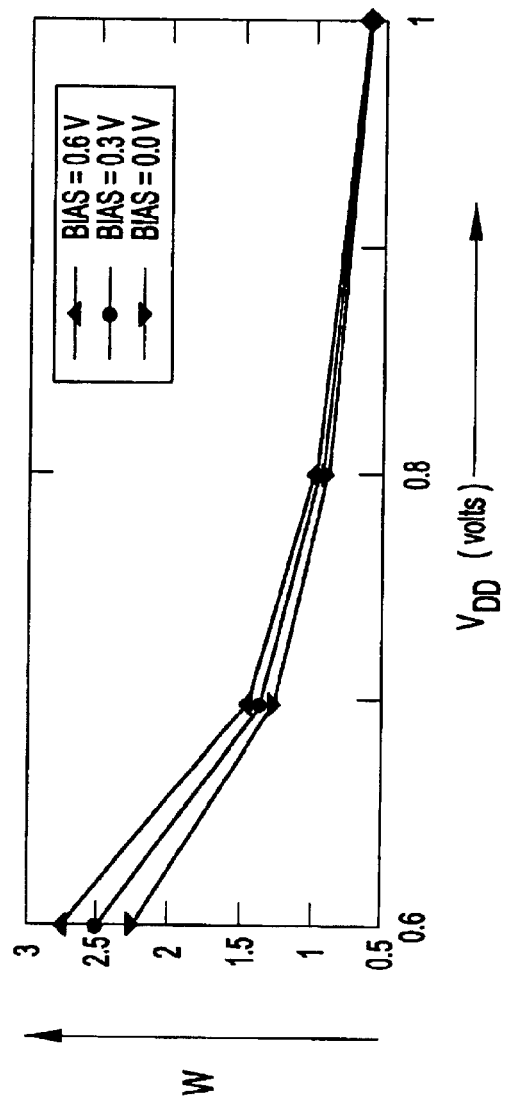
Figure 2C:
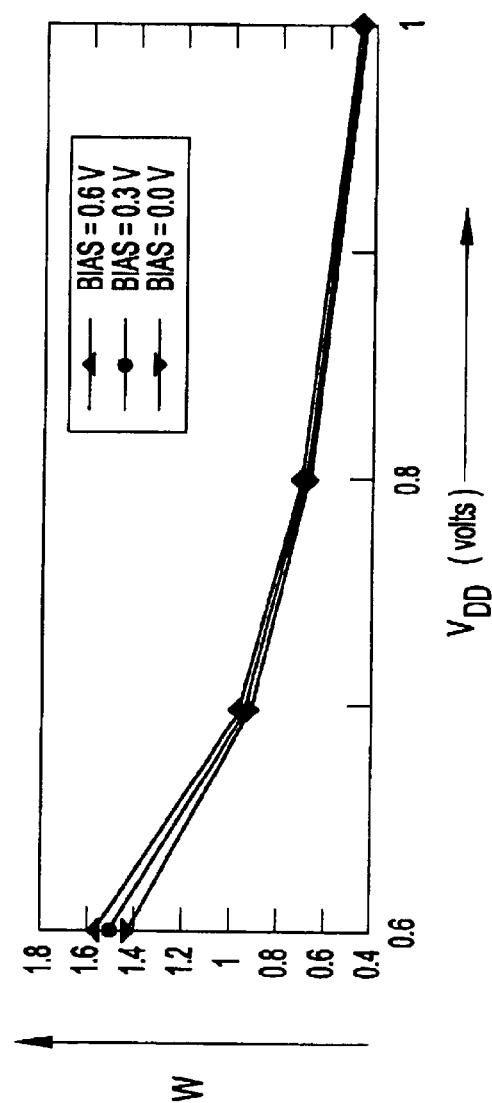

So, for example, FIGS. 2A–C show a block diagram of An 8 bit slice of a static 32-bit carry-lookahead adder 120 with corresponding worst case delays for various body bias conditions for 0.5 and 2 micron ($\mu$m) wide switching devices, e.g., 100 in FIG. 1. In this example, a single header device (e.g., switching device 100) is shared by each A/B block, i.e., one header device is used in each A block and one header device is used in each B block. The critical-path worst case delay through the adder 120 occurs when the A input value is FFFF FFFF$_h$ (a0 to a31 are HIGH) and the B input switches from 0000 0000$_h$ (b1 to b31 are LOW) to 0000 0001$_h$ (i.e., b0 switches from LOW to HIGH) or vice-versa. As the plots of FIGS. 2B–C show, this first example of FIG. 1 has application and is most advantageous where $V_{dd}$ is a relatively low voltage and the header or switching device is small, particularly PD SOI circuit applications. Advantageously, in portable applications in particular, providing header devices at selected circuits as shown in this first example provides stringent leakage power reduction with improved PD SOI active mode circuit speed as compared to the case when the bias generator 110 is not used to body bias device 100.

Any penalty in MTCMOS circuit active-mode performance from a header/footer power-switch is a function of the on resistance ($R_{on}$) of the header/footer device. The power switch drain to source voltage ($V_{ds}$) is usually very small in active mode since the power switches are sized appropriately to minimize noise at the header/footer circuit connection. This noise is referred to herein as the virtual power rail bounce. Hence, $V_{ds}$ is below the saturation voltage for the particular header/footer device is in linear mode and so, the header/footer device is in saturation. For short channel CMOS circuits, the footer power switch drain to source current ($I_{ds}$) can be approximated as: $I_{ds}$=W($V_{dd}$-$V_T$) $V_{ds}$, where W is the width of the particular header/footer device. For a device in linear region of operation, the on resistance, $R_{on}$=$V_{ds}$/$I_{ds}$. Therefore, in linear region, $1/R_{on}$=$I_{ds}$/$V_{ds}$$\alpha$W($V_{dd}$-$V_T$).

By contrast, in standby mode, the header/footer limits circuit path leakage, especially for SOI circuits, where the bodies of individual FETs are floating, and have no other current path. With the header/footer off, $V_{gs}$ is 0 and the voltage across the header/footer is $V_{dd}$, i.e., the full supply voltage magnitude. So, in standby subthreshold circuit leakage is limited by the header/footer device $I_{ds}$ and is proportional to $We^{-(q/\eta kT)V_T}$, where $\eta$ is the subthreshold swing coefficient. Thus, increasing device width (e.g., increasing W by 2× or 4×) increases both active and standby current linearly. Also, slightly increasing $V_T$ (by processing implants) linearly decreases the active current and exponentially decreases the standby subthreshold current. So, wider and higher $V_T$ devices can be used to maintain the active mode $R_{on}$ and, correspondingly, without increasing the circuit's active-mode delay, to significantly reduce circuit standby mode current, i.e., leakage. However, beyond some limit, leakage reduction abates and the advantages of increasing $V_T$ dissipates.

FIGS. 3A–B show examples of circuits (switched supply inverters 130, 132) with 2 stacked, series connected floating body header/footer devices included to reduce circuit leakage. As noted above, it is desirable that the series connected devices add no more nominal resistance than a single header device. Further, any number of stacked devices can be selected to improve leakage reduction, provided the on resistance of the series connected devices is maintained equivalent single header device. Since device on resistance is directly proportional to device width, all other things being equal, N series or stacked devices must be N times as wide as a single header device. Similarly, the stacked supply switching devices may be isolated floating body devices or, optionally, body biased by a supply connection or a bias generator, e.g., as in FIG. 1. This method of stacking the PFET headers removes the constraint of predetermining standby mode vectors as required in conventional stacking technique. Further, because the header devices are not driven from previous stages, they do not present a load that must be driven and so, need not be scaled down, as in conventional forced-stacking.

So, in FIG. 3A the inverter 130 has stacked series connected supply switching header devices 134, 136. A control signal 138 gates the header devices 134, 136, to selectively supply power or to isolate the inverter 130 at intermediate supply line 140. Similarly, the inverter 132 has stacked supply switching footer devices 142, 144. Similarly, an inverted control signal 146 gates the footer devices 142, 144, to selectively provide a path to ground or to isolate the inverter 132 at intermediate supply return line 148. For purposes of discussion of these examples, each pair of stacked supply switching devices 134, 136 and 142, 144 are taken to have identical widths. This is for example only and not intended as a limitation. Essentially, during standby, the full supply voltage, $V_{dd}$, is across stacked supply switching devices 134, 136 or 142, 144. Thus, the drain to source voltage ($V_{ds}$) for each is less than $V_{dd}$, thereby substantially reducing leakage current in each header or footer significantly and, as a result, in the circuit 130, 132. Thus, using stacked floating body header and footer devices 134, 136, or 142, 144, reduces standby-mode sub-threshold leakage power an order of magnitude, as compared to a single header or footer and, active-mode circuit speed is improved. So, stacked headers/footers minimize overall standby power.

Figure 4A:
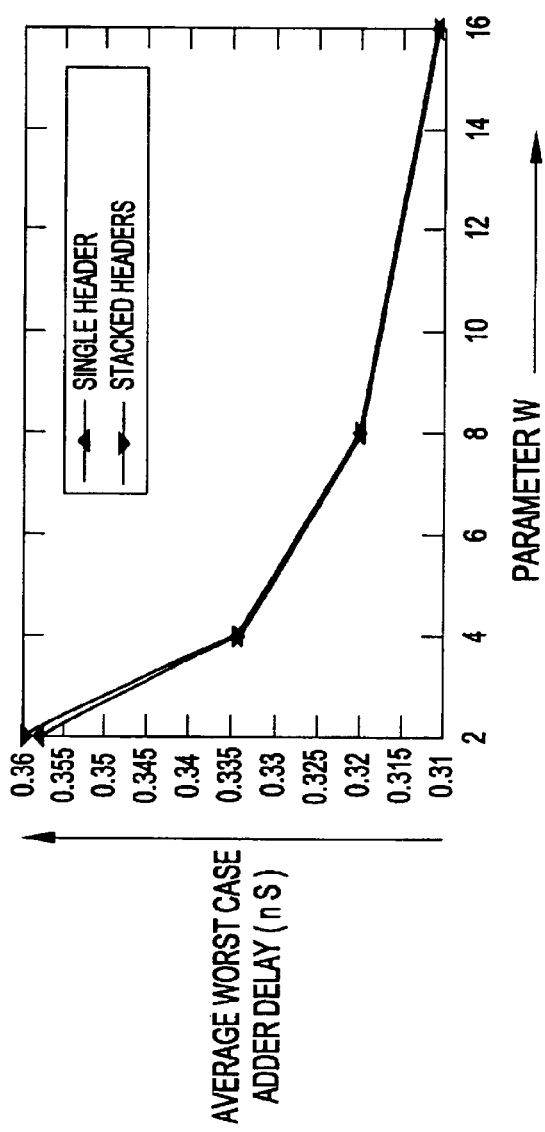
Figure 4B:
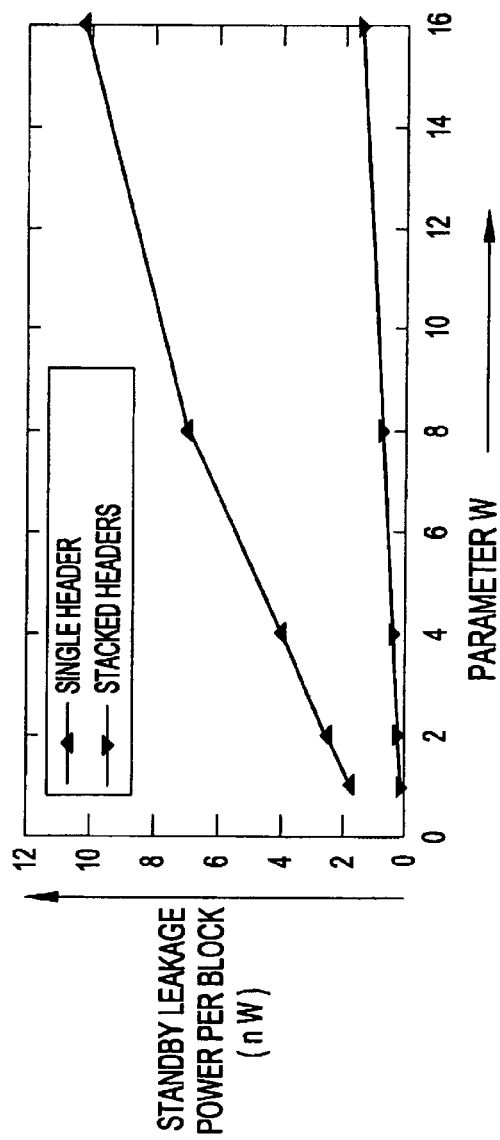

FIGS. 4A–D show circuit performance and leakage comparisons at two different supply voltages, i.e., $V_{dd}$=1.2V and 0.7V, for the same switched logic gate, comparing single header devices to preferred embodiment multiple (2) header devices, stacked and with the same effective device width. In this example the width of the stacked PFETs (e.g., 134, 136) is identical and double that of the single header device. Thus, FIG. 4A compares the effect on average worst case delay at $V_{dd}$=1.2V from using a single header device verses two series stacked devices. FIG. 4B compares the effect on leakage power at $V_{dd}$=1.2V from using a single header device verses two series stacked devices. FIG. 4C shows the effect on average worst case delay at $V_{dd}$=0.7V from using a single header device verses two series stacked devices. FIG. 4D shows the effect on leakage power at $V_{dd}$=0.7V from using a single header device verses two series stacked devices. Optionally, for additional performance improvement the stacked header devices may be made wider than desired effective single device for simultaneous reduction in both standby-leakage power and active mode delay, as compared to a single header; provided, however, the appurtenant area penalty (of two larger header PFETs instead of a single smaller device) is acceptable or is amortized by sharing amongst multiple logic stages as described with reference to the example of FIG. 1.

FIG. 5 shows an example of a NAND gate 160 with decoupling capacitors 162 that may be provided in parallel with header devices, in particular with the gated header device 100 of FIG. 1 or the stacked header embodiment 130 of FIG. 3A. Supply line capacitances typically act to filter the supply voltage and, especially, decouple high frequency noise at the supply line. Unfiltered high frequency noise is another source of parasitic power loss and impairs circuit performance. The supply line capacitance is substantially lower for SOI than for a similar bulk structure because SOI junction capacitance and metal to substrate capacitances are much lower than for identically sized bulk capacitances. Consequently, the capacitance of the intermediate or gate supply line, i.e., the gated supply node 164 at which the logic circuits (NAND gate 160) attach to the header devices, is not high enough to filter transient noise and current surges can cause the gated supply line to bounce. The decoupling capacitors increase intermediate supply line capacitance, providing a parallel path to ground (through $V_{dd}$) for noise current.

Figure 6A:
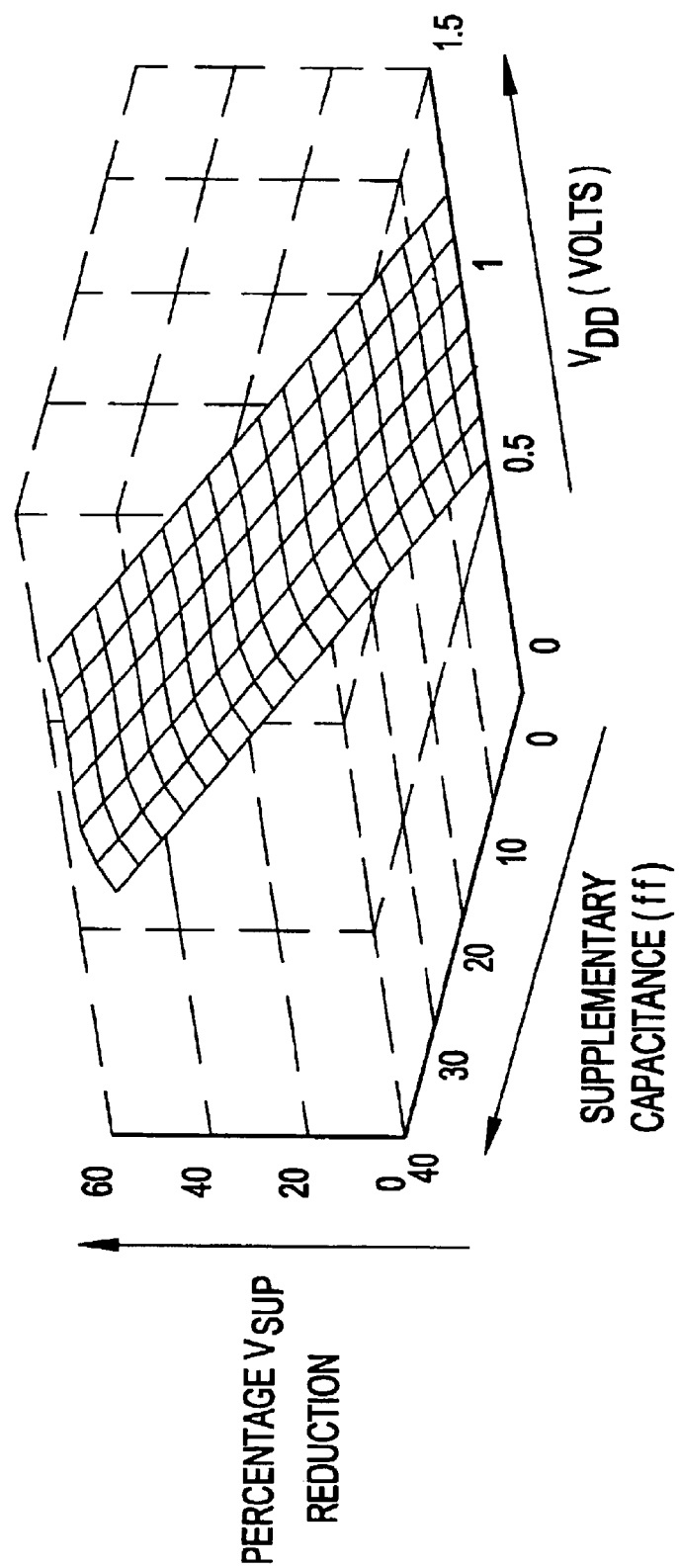
FIGS. 6A–C show the high frequency noise improvement from including a decoupling capacitor on a gated supply line in a 32-bit static carry-lookahead adder.
Figure 6B:
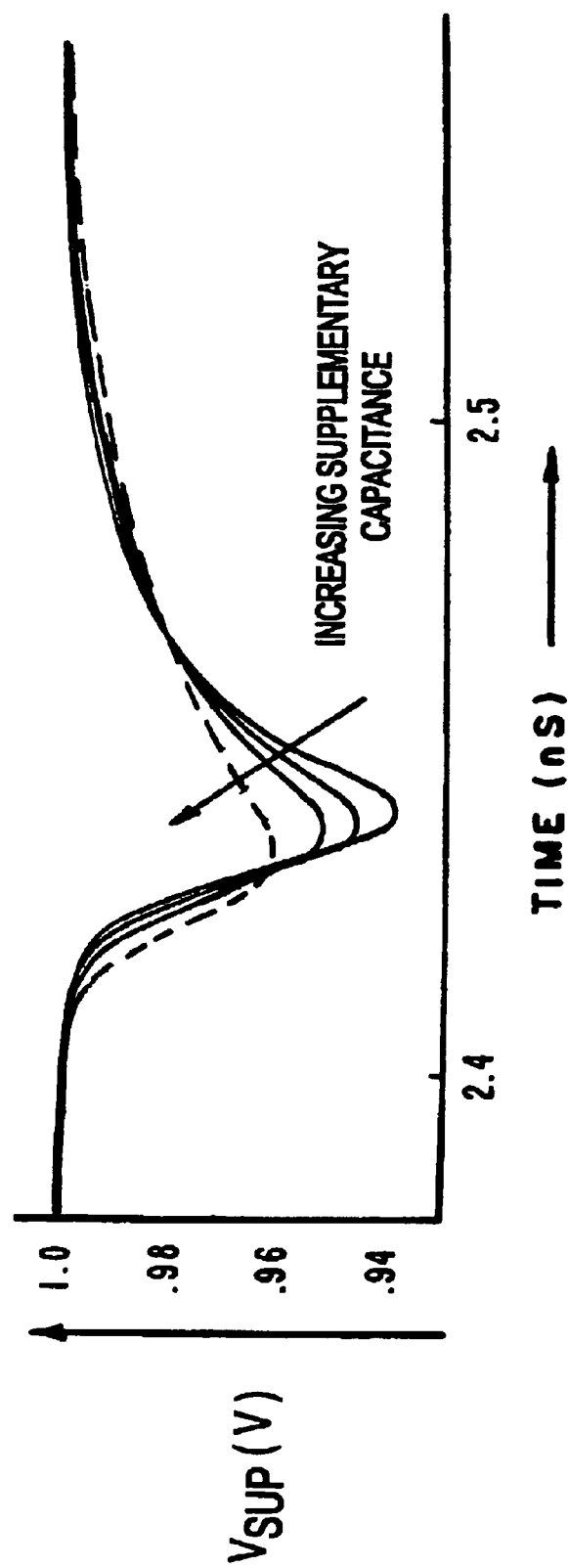
Figure 6C:
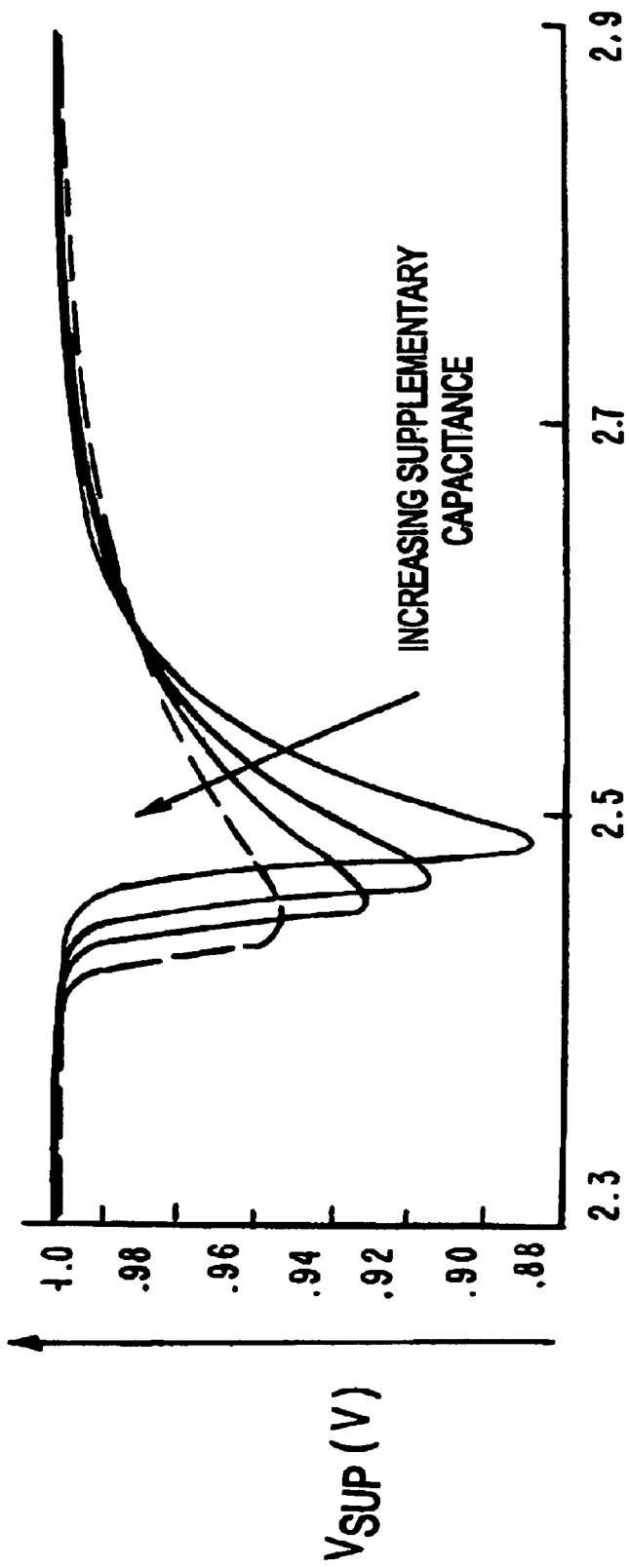

FIGS. 6A–C show the high frequency noise improvement from including a decoupling capacitor on a gated supply line in a 32-bit static carry-lookahead adder, e.g., 120 of FIG. 2A. FIG. 6A shows that decoupling capacitors improve bounce suppression over a wide range of supply voltages with the amount of suppression proportional to decoupling capacitance added. FIGS. 6B–C show the advantages of adding decoupling capacitance for each of a 4 $\mu$m and a 1 $\mu$m wide header device, further indicating that decoupling is particularly advantageous and provides more noise suppression for narrower header devices.

Figure 7:
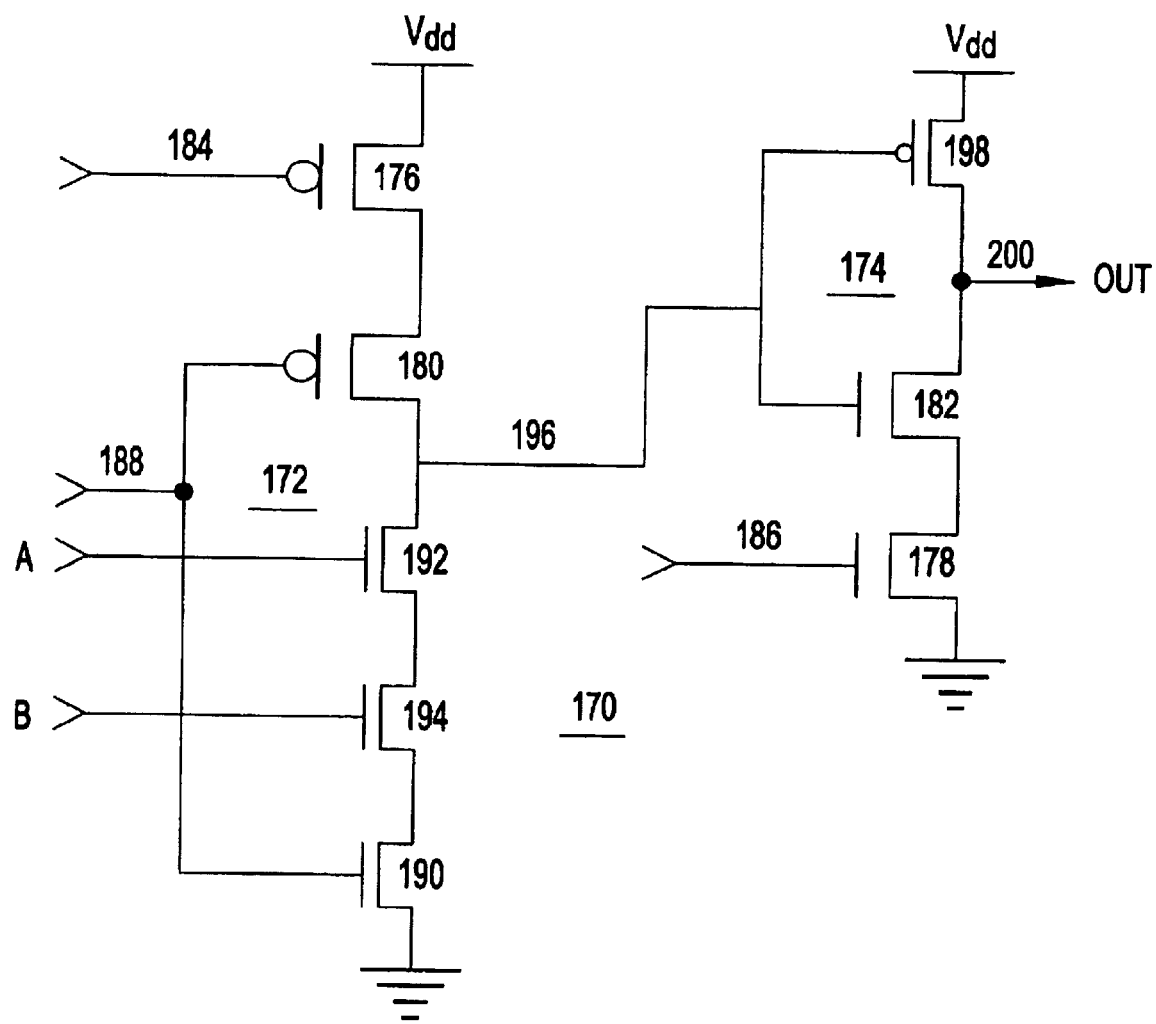
FIG. 7 shows a third example in a cross section of a preferred embodiment dynamic or pulsed logic path.

FIG. 7 shows a third example in a cross section of a preferred embodiment dynamic or pulsed logic path 170 also may be referred to as a wave pipelined path and is especially suited for dynamic and pseudo static logic. Logic path 170 Alternate circuits, pulsed NAND gate 172 and inverter 174 in this example, have high threshold supply switching devices 176, 178 paired with high threshold circuit devices 180, 182, respectively. The high threshold supply switching devices 176, 178 are gated by a complementary control signal 184, 186 and selectively supply and isolate logic circuits 172, 174 from alternate supply lines, i.e., $V_{dd}$ and ground. In particular, the high threshold devices 176, 180 and 178, 182 are stacked in the pre-charge path and cascaded in a wave-pipeline fashion such that when the path logic is in standby (184 high and 186 low), all of the logic in the path is predisposed with both stacked devices 176, 180 and 178, 182 off in each circuit 172, 174, respectively, reducing sub-threshold leakage significantly. The reduction is substantially similar to that for the static inverter 130 of FIG. 3A. Inputs to this path 170 include a clock 188 gating high threshold device 180 and a normal NFET 190, an A input to the gate of normal NFET 192 and a B input to the gate of normal NFET 194. The output 196 of pulsed NAND gate 172 drives high threshold circuit device 182 and a normal PFET 198.

The path 170 is enabled and brought out of standby by switching complementary control signals 184 and 186 low and high, respectively. The clock is driven low to preset the pulsed NAND gate output 196 high during precharge. With the pulsed NAND gate output high 196, the inverter output 200 is driven low. The path switches state (i.e., pulsed NAND gate output 196 low and inverter output 200 high) after the clock rises, only if its A and B inputs are high during evaluate phase. A, B and clock are also set to high during standby mode. Any preset or pre-charge delay attributable to enabling the path 170 is coincident with or absorbed in propagation through the first stage 172. Further, the high threshold switched devices 176, 178 also reduce cross-over current during switching, further enhancing performance.

Although some leakage current has been realized by stacking 2 high $V_T$ devices, leakage may be further reduced by stacking additional high $V_T$ devices in both static and dynamic logic, since it is well known that stacking of multiple off devices considerably reduces subthreshold leakage. Principally, to optimize for minimum performance impact and maximum leakage reduction, the header/footer device on resistance is minimized, while its off resistance is maximized. Simulation results are discussed hereinbelow for the multiple stacked off devices in static logic. However, this is for example only and not intended as a limitation. Stacking header/footer devices can easily be applied to dynamic circuits, e.g., 170 of FIG. 7.

Figure 8A:
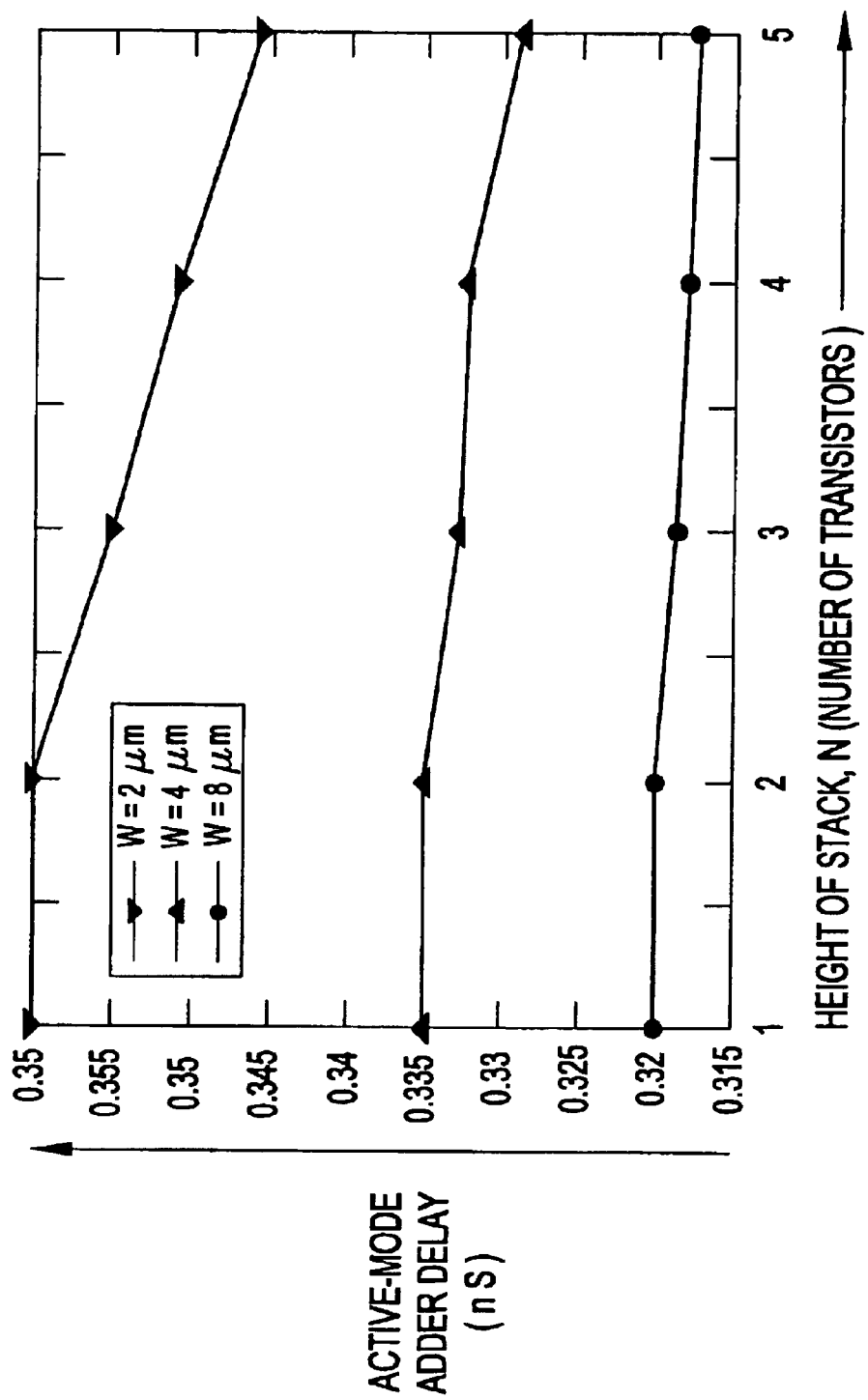
FIGS. 8A–B show the effect of stacked PFET header stack height (N stacked devices) on delay and leakage for the 32-bit static carry-lookahead adder.
Figure 8B:
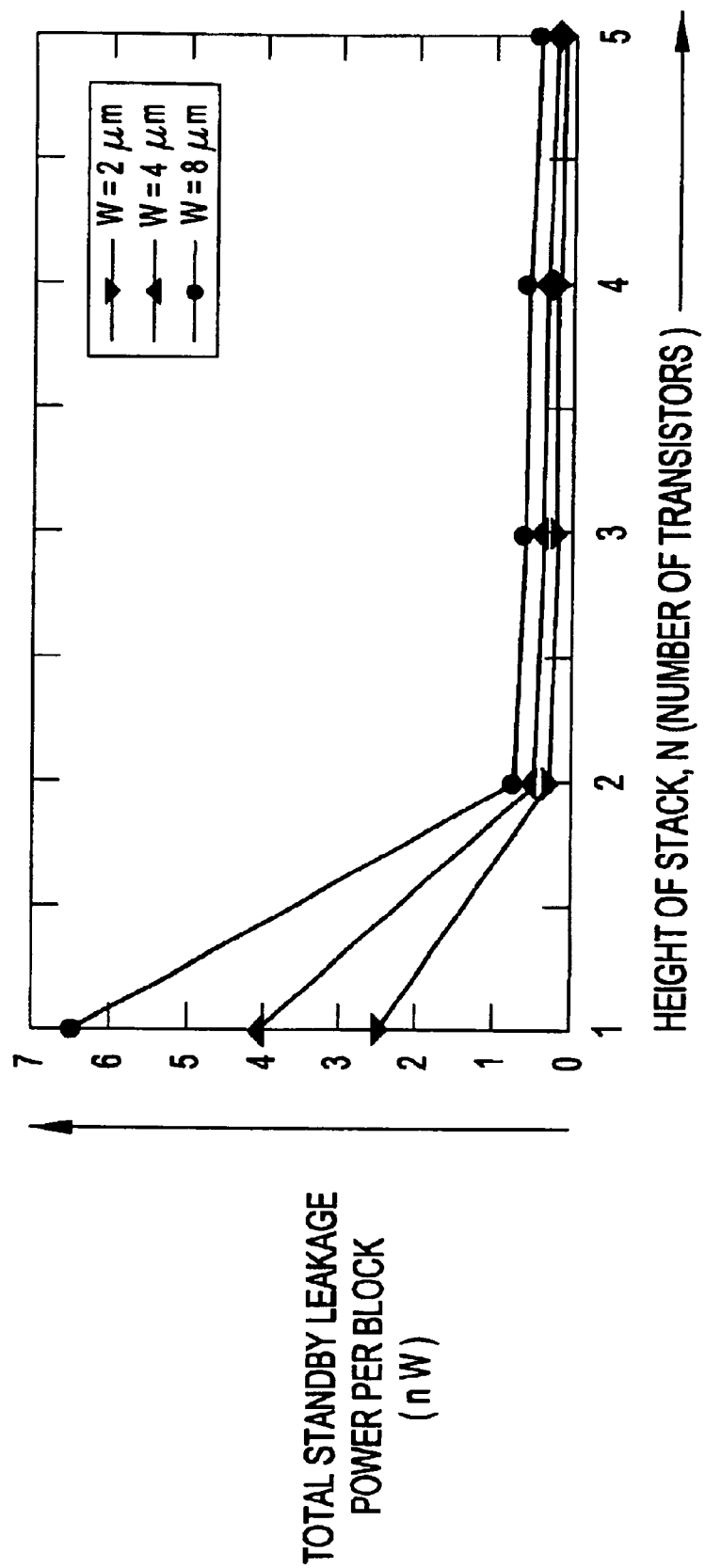

FIGS. 8A–B show the effect of stacked PFET header stack height (N stacked devices) on delay and leakage for the 32-bit static carry-lookahead adder 120 of FIG. 2A. While increasing N from 1 to 2 produces an order of magnitude reduction in standby leakage power, increasing N from 2 to 5 only produces an additional 2× leakage reduction. Further, although the delay drops off, marginally as N is increased, the area for the header devices increases circuit area. Thus, it can be seen that N=2 is, normally, an optimum stack height value. As shown in the examples hereinabove off resistance can be increased by stacking devices, while the on resistance for the stack can be maintained by widening the stacked devices.

Primarily, standby leakage power should be minimized for any design only when design delay constraints for each circuit can be satisfied. So, rather than simply double the size of both series connected high threshold devices 134, 136 or 142, 144 in FIG. 3A–B, preferably, they are tapered to provide substantially the same $I_{ds}$ as a single high threshold device in active mode and significantly increase off resistance. Normally, for tapering in logic circuits, the largest devices are located closest to the supply connections, narrowing gradually in the direction of the output node, so as to minimize internal node and load capacitances that continuously charge/discharge at every clock cycle, which adds to active power.

So, for additional leakage reduction optimization, stacked header/footer devices may be selectively tapered to minimize standby-leakage power while still satisfying the particular delay constraint. So, from the example of FIGS. 8A–B, an optimum design point is identified including selecting 2 header/footer devices in the stack for selecting a taper ratio, the ratio of the width of each series stacked device to its adjacent stacked device. In selecting the taper ratio, in addition to the effect of header/footer stack taper on static path delay and leakage power, the effect of taper ratio on intermediate supply levels and bounce (described hereinabove) and wakeup time (from standby or sleep to active) must all be considered.

So, since on resistance is inversely proportional to device width, all other parameters remaining constant, device resistance can be approximated as the device unit width resistance ($R_0$) divided by device width, i.e., $R_0/W_1$, where $R_0$ is the resistance of a device 1 unit wide. So, for a single device, K units wide, device resistance is $R_0/K$, where K is any positive real number. Thus, either of the logic circuits 130, 132 of the two stacked device (N=2) examples of FIGS. 3A–B with the width of the particular high $V_T$ supply switching device 134, 144 being designated $W_{M0}$ and the width of the other stacked high VT supply switching device 136, 142 being designated $W_{M1}$, the sum of the corresponding resistances $(R_0/W_{M0})+(R_0/W_{M1})$ should be less than or equal to $(R_0/K)$, where K is the width of an equivalent single header/footer. Of course, if the header/footer stack includes more devices, the sum of the corresponding resistances would include another resistance for each additional device. So, from the sum of the corresponding resistances, at the very least $(1/W_{M0})+(1/W_{M1})$ should be less than or equal to $(1/K)$ to maintain performance and to prevent the circuit delay degradation as compared to a single header/footer scheme. Relating $W_{M1}$ to $W_{M0}$, $W_{M1}=K*W_{M0}/(W_{M0}-K)$, with the lower asymptote for each $W_{M0}$ and $W_{M1}$ being K. It should be noted that this relationship has application to any circuit with stacked header/footer devices such as the examples of FIG. 7 with stacked high $V_T$ devices 180, 176 and 182, 178 respectively.

Figure 9:
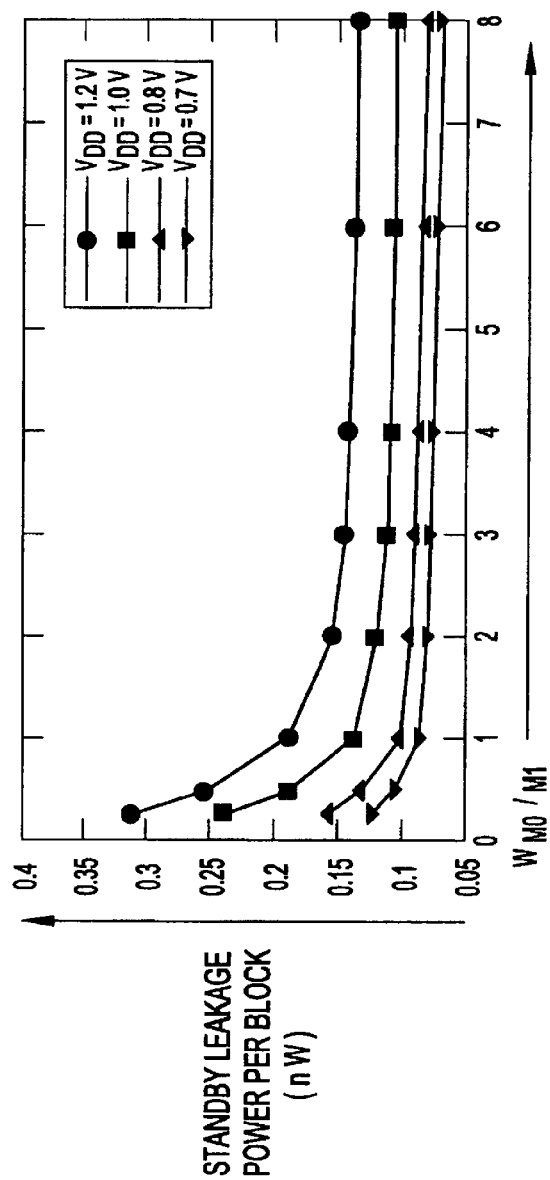
FIG. 9 shows a comparison of total standby leakage power and taper ratio for N=2 at several voltages.
Figure 10:
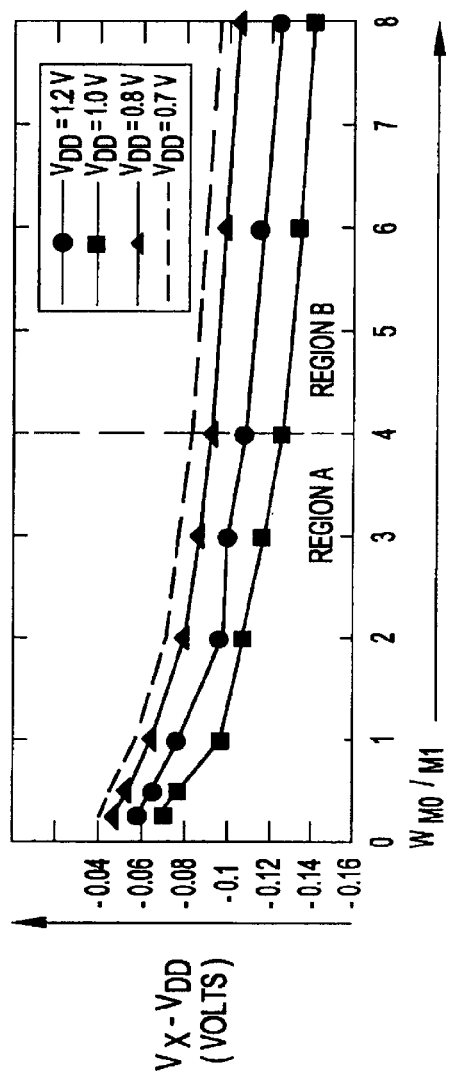
FIG. 10, which shows the intermediate supply standby voltage ($V_X$) at the node X between the two header/footer devices.

FIG. 9 shows a comparison of total standby leakage power and taper ratio for N=2 at several voltages. From this example, over a taper ratio ($W_p/W_s$) range of 0.33 (1:3) to 8 (8:1), increasing taper ratio from 0.33 to 4 cuts power in half regardless of supply voltage. Beyond 4, increasing taper ratio provides no appreciable additional leakage power reduction. This can be qualitatively understood from FIG. 10, which shows the intermediate supply standby voltage ($V_X$) at the node X between the two header/footer devices (PFET headers in this example) over the same taper ratio range. $V_X$ is determined by the same sub-threshold leakage current flowing through both the high-$V_T$ PFETs 134, 136 in standby mode. Since ($V_X-V_{dd}$) is also the $V_{sg}$ (source to gate voltage) for the lower PFET in standby mode, $V_X$ controls the sub-threshold leakage through the stacked devices. Since, the subthreshold leakage in PFETs is proportional to $e^{((q/nkT)V_{sg})}$, the leakage reduces significantly even for 100 mV reduction in ($V_X-V_{dd}$). So, leakage decreases as taper ratio approaches 4 for this example with little additional reduction beyond 4. Thus, while the taper ratio to minimize leakage reduction is 4, for this example, performance must also be considered for an optimum taper ratio.

Figure 11:
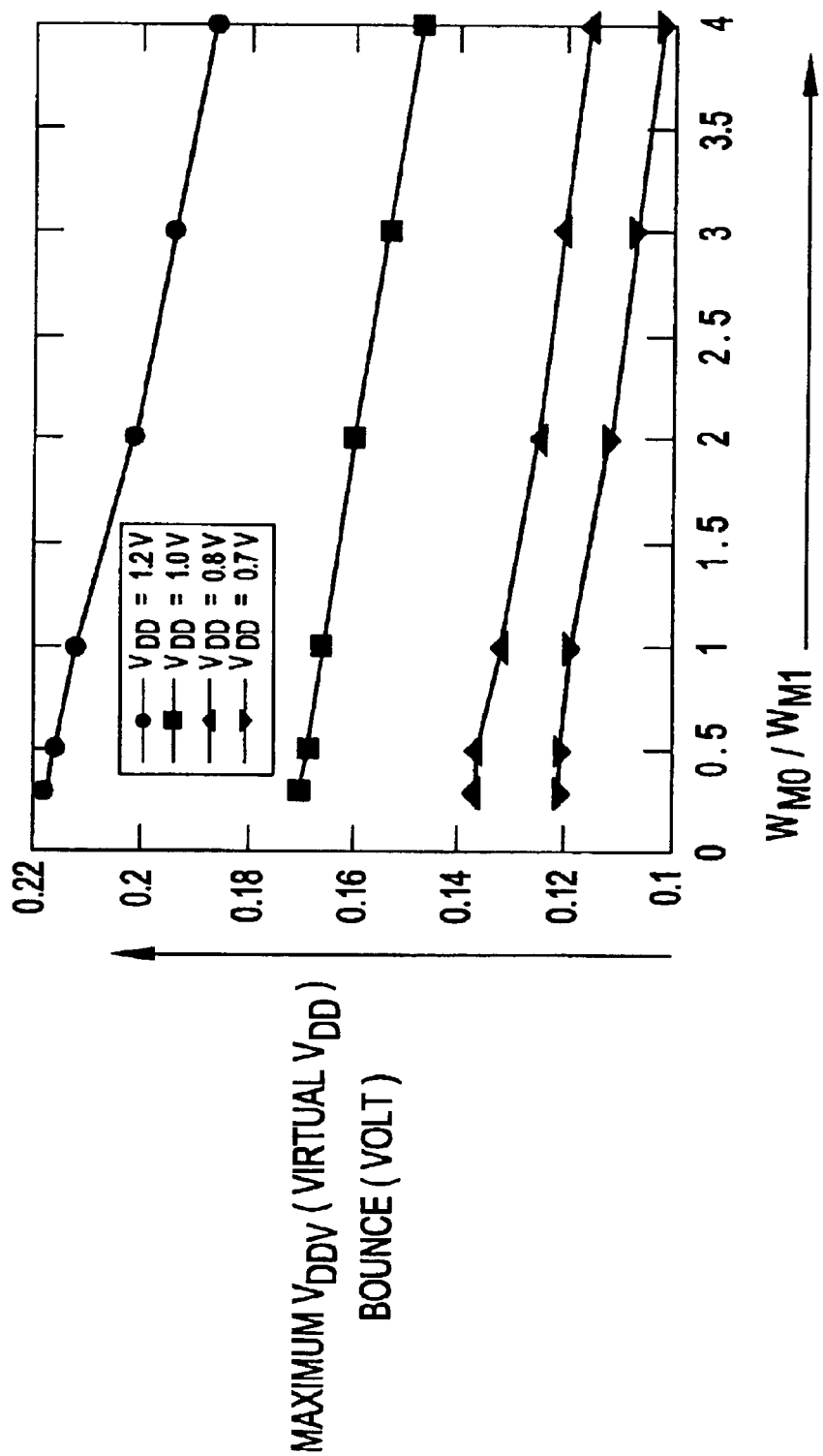
FIG. 11 shows a comparison of intermediate supply bounce and taper ratio for several voltages.

FIG. 11 shows a comparison of intermediate supply bounce and taper ratio for several voltages over a taper range from 0.33 to 4, indicating that increasing taper ratio improves intermediate supply noise suppression. As noted hereinabove, circuit performance is inversely related to intermediate supply bounce. Increasing $W_{M0}$ and, correspondingly, the taper ratio, increases the virtual $V_{dd}$ capacitance thereby reducing intermediate supply bounce in this example.

Figure 12:
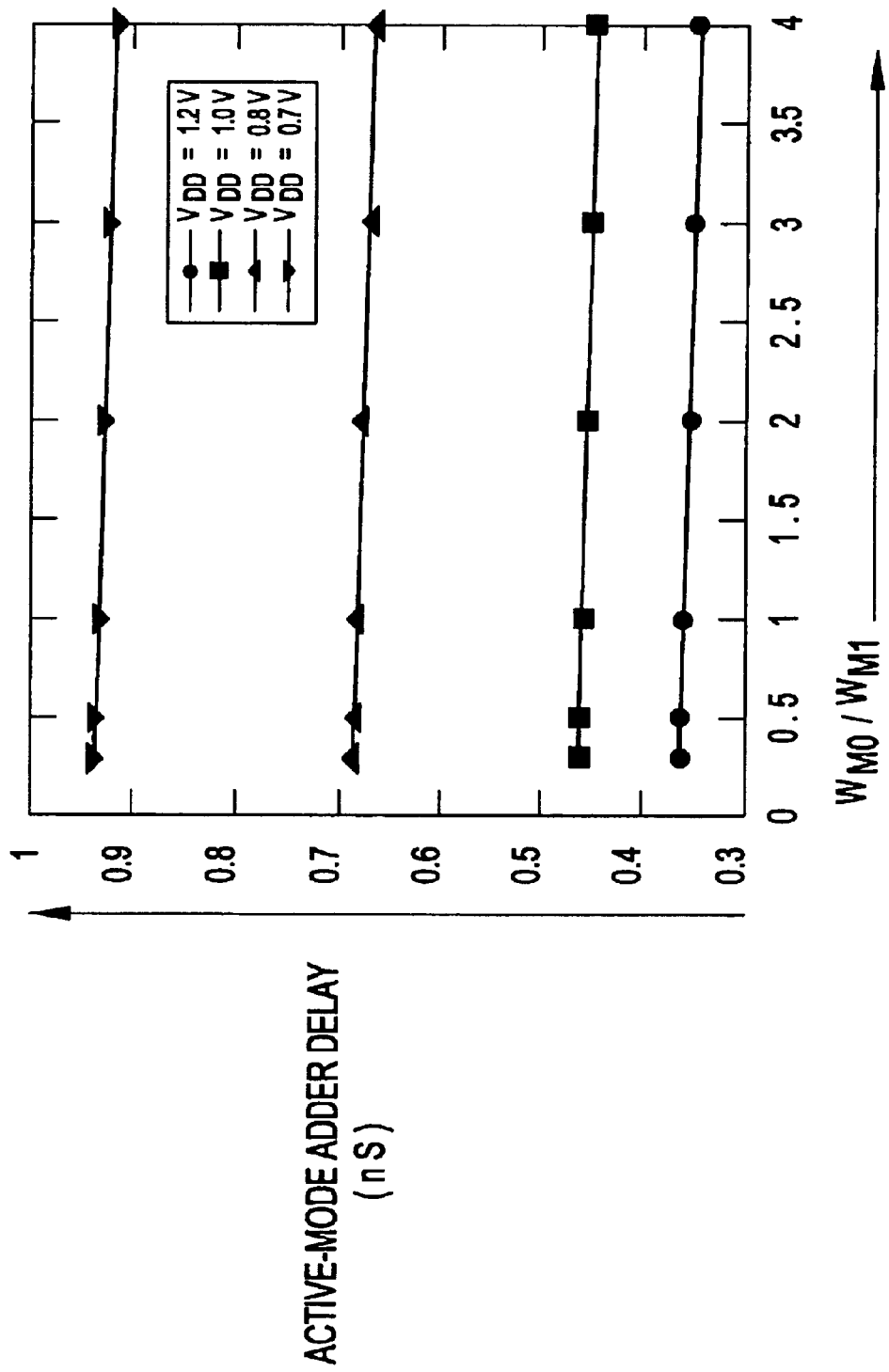
FIG. 12 shows a comparison of active mode delay and taper ratio for several voltages.
Figure 13:
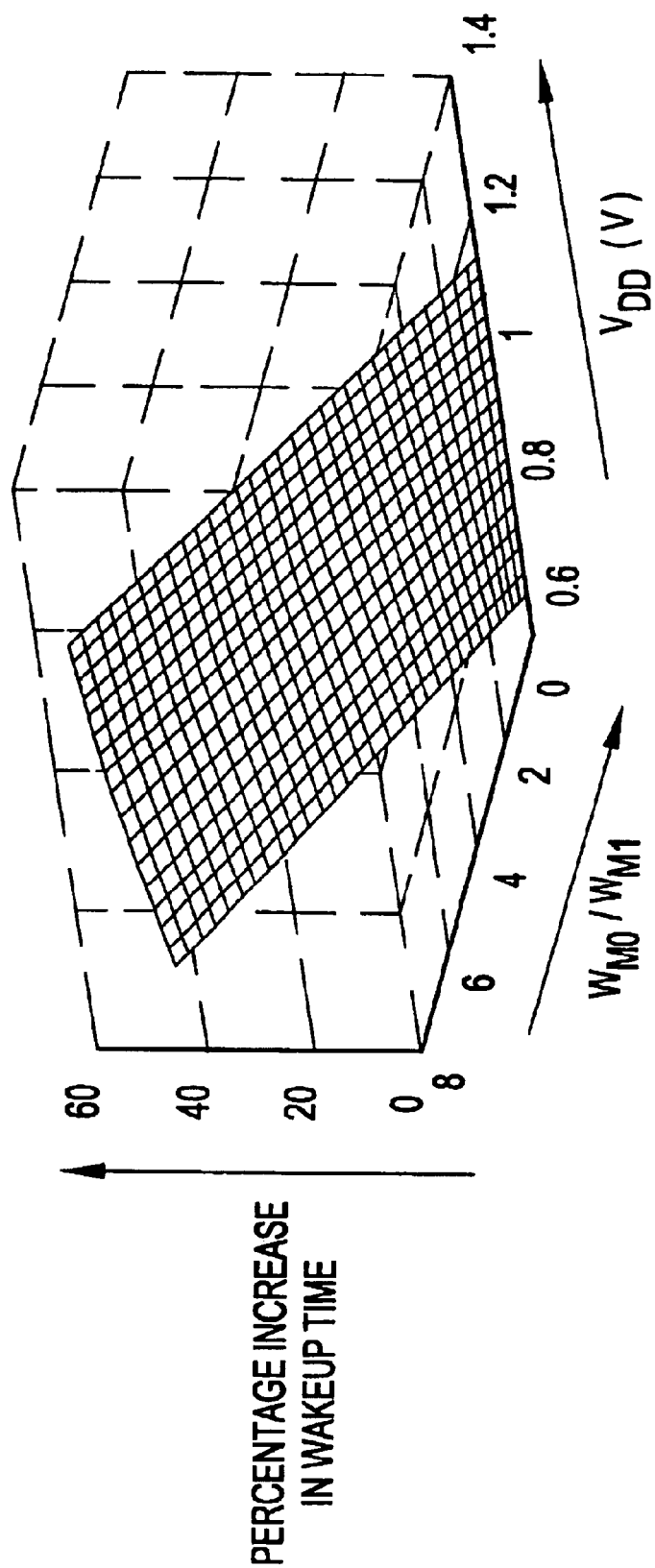
FIG. 13 shows a comparison of circuit wakeup time (i.e., how long a circuit takes to switch from standby to active mode) change and taper ratio.

FIG. 12 shows a comparison of active mode delay and taper ratio for several voltages. From this example, over the same taper ratio range of 0.33 to 4, delay improves from 2.5–4%. So, active mode delay also decreases as taper ratio approaches 4 for this example with little additional reduction beyond 4. FIG. 13 shows a comparison of circuit wakeup time (i.e., how long a circuit takes to switch from standby to active mode) change and taper ratio for several voltages over the taper ratio range from 0.33 to 8. By contrast with the above examples, circuit wake up time increases with taper ratio, 50% over the same taper ratio range from 0.33 to 4 for this example. However, since the typical circuit wakeup time is less than 1 nanosecond (1 nS), the wakeup penalty for the larger taper is still minor. Thus, for this example, 4 is the optimum tapering ratio in a 2-header stack. Typically, the area penalty is less than 3%, especially if the headers are shared by multiple circuits.

Thus having determined the effect of stack height and taper ratio on leakage and circuit delay compact empirical formulas may be determined to succinctly model the circuit delay ($t_{delay}$) and standby leakage power ($P_{standby}$). In particular, for a single equivalent device width (W) with stack height (N) and taper ratio (T):

$$t_{delay} = (t_0 - N/a - W/b)(1 - T/c) \text{ and}$$

$$P_{standby} = (k_0 + k_1 \exp(-N^2))(W/2)^d (j_0 + \exp(-T)),$$

where a, b, c, d, $k_0$, $k_1$ and $j_0$ are process dependent coefficients and $t_0$ is the delay with a single header/footer device.

Advantageously, the present invention provides reduced leakage circuits optimized to minimize standby-leakage power for SOI circuits while simultaneously minimizing circuit delay impact, especially for PD and FD SOI circuits and integrated circuits. An empirically derived delay and power model optimizes SOI circuit header selection.

While the invention has been described in terms of preferred embodiments, those skilled in the art will recognize that the invention can be practiced with modification within the spirit and scope of the appended claims.

What is claimed is:

1. An integrated circuit (IC) comprising:
   a plurality of functional units selectively communicating with each other;
   a plurality of logic circuits connected together in ones of said plurality of functional units, connected said logic circuits in each of said ones defining function therein;
   selectable supply switching devices disposed at ones of said logic circuits selectively supplying power and alternately isolating connected said logic circuits, said selectable supply switching devices turning on at a threshold voltage having a magnitude greater than like devices in said logic circuits, wherein said devices are field effect transistors(FETs), ones of said selectable supply switching devices are p-type FETs (PFETs) connected between a supply line ($V_{dd}$) and an intermediate supply line;
   a decoupling capacitor at each said intermediate supply line; and
   a switchable bias supply at each selectable supply switching device selectively reducing threshold voltage magnitude responsive to said each selectable supply switching device supplying power.

2. An IC as in claim 1, wherein whenever ones of said selectable supply switching devices are supplying power to said connected logic circuits, said switchable bias supply at said ones provides a body bias of $V_{dd}$–0.7V to said one.

3. An IC as in claim 2, wherein whenever ones of said selectable supply switching devices are isolating said connected logic circuits, said switchable bias supply at said ones provides a body bias of $V_{dd}$ to said one, whereby leakage current in and off said one is substantially reduced with said body bias of $V_{dd}$ over said off ones with body bias $V_{dd}$–0.7V.

4. An IC as in claim 1, wherein at least one said intermediate supply line is connected to two or more of said logic circuits.

5. An integrated circuit (IC) comprising:
   a plurality of functional units selectively communicating with each other;
   a plurality of logic circuits connected together in each of said plurality of functional unit, connected said logic circuits in each functional unit defining function in said each unit;
   selectable, supply switching devices disposed at ones of said logic circuits selectively alternately supplying power and isolating connected said logic circuits, said selectable supply switching devices being a high threshold device turning on at a threshold voltage having a magnitude greater than at least one like device in said logic circuits, each laid of selectable supply switching devices being one in a series of stacked high threshold device, wherein said devices are field effect transistors (FETs) ones of said selectable supply switching devices are p-type FETs (PFETs) connected between a supply line ($V_{dd}$) and an intermediate supply; and
   a decoupling capacitor at each said intermediate supply line.

6. An IC as in claim 5, wherein said selectable supply switching PFETs are each one of a pair series of stacked said high threshold PFETs, one of each of said pairs being connected to $V_{dd}$ and the other of said pair being connected to said intermediate supply line.

7. An IC as in claim 6, wherein at least one said intermediate supply line is connected to two or more said logic circuits.

8. An IC as in claim 5, wherein remaining ones of said selectable supply switching devices are n-type FETs (NFETs) connected between a supply return line (Gnd) and an intermediate return line.

9. An IC as in claim 8, wherein said series stacked said high threshold devices comprises:
   a plurality of high threshold PFET pairs, a first PFET of each of said PFET pairs being connected between $V_{dd}$ and said intermediate supply line; and
   a plurality of high threshold NFET pairs, a first NFET of each of said pairs being connected between Gnd and said intermediate return line.

10. An IC as in claim 9, wherein ones of said first PFET are paired with a plurality of second PFETs.

11. An IC as in claim 9, wherein ones of said first NFET are paired with a plurality of second NFETs.

12. An IC as in claim 9, wherein a second PFET of said plurality of high threshold PFET pairs is a logic circuit PFET in one first supply switched logic circuit and a second NFET of said plurality of high threshold pairs is a logic circuit NFET in one second supply switched logic circuit.

13. An IC as in claim 12, wherein a logic path in at least one of said plurality of functional units comprises alternating first supply switched logic circuits and second supply switched logic circuits.

14. An IC as in claim 5, wherein series of stacked said high threshold devices are tapered widest to narrowest with the widest said high threshold devices being disposed in said series nearest to a logic circuit output and the narrowest at supply connections.

15. An IC as in claim 14, wherein tapered said series of stacked high threshold devices have a taper ratio of 4, each said high threshold devices in said tapered series being 4 times wider than its next adjacent narrower stacked said device.

16. An IC as in claim 15, wherein said tapered series of stacked high threshold devices comprises 2 said high threshold devices.

17. An integrated circuit (IC) comprising:

a plurality of functional units selectively communicating with each other;

a plurality of logic circuits connected together in each of said plurality of functional units, connected said logic circuits in each functional unit defining function in said each unit;

selectable supply switching devices disposed at ones of said logic circuits selectively alternately supplying power and isolating connected said logic circuits, said selectable supply switching devices being a high threshold device turning on at a threshold voltage having a magnitude greater than at least one like device an said logic circuits, each said of selectable supply switching devices being one an a series of stacked high threshold devices, wherein said devices are field effect transistors (FETs), ones of said selectable supply switching devices are n-type FETs (NFETs) connected between a supply mum line (Gnd) and an intermediate return line; and a decoupling capacitor at each said intermediate return line.

18. An IC as in claim 17, wherein said selectable supply switching NFETs are each one of a pair series of stacked said high threshold NFETs, one of each of said pairs being connected to Gnd and the other of said pair being connected to said intermediate return line.

19. An IC as in claim 18, wherein at least one said intermediate return line is connected to two or more of said logic circuits.

* * * * *